(12) United States Patent  
Irfan et al.

(10) Patent No.: US 11,574,680 B2  
(45) Date of Patent: Feb. 7, 2023

(54) BANK-SELECTIVE POWER EFFICIENT CONTENT-ADDRESSABLE MEMORY

(71) Applicant: City University of Hong Kong, Hong Kong (CN)

(72) Inventors: Muhammad Irfan, Peshawar (PK); Ray C. C. Cheung, Hong Kong (HK); Zahid Ullah, Peshawar (PK)

(73) Assignee: City University of Hong Kong, Hong Kong (HK)

(*) Notice: Subject to any disclaimer, the term of this patent is extended or adjusted under 35 U.S.C. 154(b) by 86 days.

(21) Appl. No.: 17/353,803

(22) Filed: Jun. 21, 2021

(65) Prior Publication Data

US 2021/0398591 A1    Dec. 23, 2021

Related U.S. Application Data

(60) Provisional application No. 63/042,604, filed on Jun. 23, 2020.

(51) Int. Cl.
*G11C 15/00* (2006.01)
*H03K 19/17728* (2020.01)

(52) U.S. Cl.
CPC ....... *G11C 15/00* (2013.01); *H03K 19/17728* (2013.01)

(58) Field of Classification Search
CPC .................................................. G11C 15/00
(Continued)

(56) References Cited

U.S. PATENT DOCUMENTS 7,155,563 B1    12/2006  Somasundaram  
8,031,501 B1 *  10/2011  Nataraj ................. G11C 15/04  
                                                        365/49.1

(Continued)

FOREIGN PATENT DOCUMENTS

WO    2011071273 A2    6/2011

OTHER PUBLICATIONS

K. Locke, "Parameterizable Content-Addressable Memory", Xilinx, Mar. 2011, pp. 1-31.
(Continued)

*Primary Examiner* — Anthan Tran  
(74) *Attorney, Agent, or Firm* — Idea Intellectual Limited; Margaret A. Burke; Sam T. Yip

(57) ABSTRACT

The present invention provides a power efficient content-addressable memory (CAM) architecture that is implementable on FPGAs. The provided CAM architecture comprises an array of CAM cells having a width $C_W$ and a depth $C_D$, and being grouped into a B number of memory banks. Each of the CAM cells is configured for storing a memory bit and comprises a plurality of flip-flops configured to store at least a masking bit indicating the ternary nature of the stored memory bit and a storing bit saving the binary information of the stored memory bit. The provided CAM architecture allows activating only one bank in multiple banks irrespective of nature of the data set and is updated in a single access and saves power consumption by only accessing the memory in the activated bank. The dynamic power consumption is reduced by 40% compared with the state-of-the-art FPGA-based CAMs.

15 Claims, 8 Drawing Sheets

(58) Field of Classification Search
USPC .................................................. 365/49.17
See application file for complete search history.

(56) References Cited

U.S. PATENT DOCUMENTS

| | | | | |
|---|---|---|---|---|
| 8,861,241 | B1 * | 10/2014 | Estan | ............... G11C 15/04 365/49.1 |
| 2021/0134366 | A1 | 5/2021 | Irfan et al. | |

OTHER PUBLICATIONS

"Ternary Content Addressable Memory (TCAM) Search IP for SDNet", Xilinx SmartCORE IP Product Guide, Nov. 2017, pp. 1-36.

Z. Qian et al., "Low Power RAM-Based Hierarchical CAM on FPGA", IEEE, 2014.

F. Syed et al., "Fast Content Updating Algorithm For an SRAM-Based TCAM on FPGA", IEEE Embedded Systems Letters, vol. 10, Issue 3, Sep. 2018, pp. 73-76.

Z. Ullah et al., "Hybrid Partitioned SRAM-Based Ternary Content Addressable Memory", IEEE Transactions on Circuits and Systems I: Regular Papers, vol. 59, Issue 12, Dec. 2012, pp. 2969-2979.

Z. Ullah et al., "UE-TCAM: An Ultra Efficient SRAM-based TCAM", IEEE, 2015.

I. Ullah et al.,"DURE: An Energy- and Resource-Efficient TCAM Architecture for FPGAs With Dynamic Updates", IEEE Transactions on Very Large Scale Integration (VLSI) Systems, 2019, pp. 1-10.

M. Irfan et al., "G-AETCAM: Gate-Based Area-Efficient Ternary Content-Addressable Memory on FPGA", IEEE Access, vol. 5, Sep. 2017, pp. 20785-20790.

M. Irfan et al., "RPE-TCAM: Reconfigurable Power-Efficient Ternary Content-Addressable Memory on FPGAs", IEEE Transactions on Very Large Scale Integration (VLSI) Systems, pp. 1-5.

* cited by examiner

Algorithm 1 Search Operation in $B$-Banks RPE-TCAM ($C_D \times C_W$)

Input: $C_W$ bits search word ($Sw$))
Output: Address where the search word is found ($Addr$).

1: for $i \leftarrow 0$ *to* $i \leftarrow \log_2(B)$ do
2:   if ( $Sw[\log_2 B - 1 : 0] == \text{to\_binary}(i)$ ) then {
3:     $x <= i * (C_D / B)$;
4:     $y <= i * 2 * (C_D / B)$;
5:     break; }
6:   for $j \leftarrow x$ *to* $j \leftarrow y$ do
7:     $M\_L[j] <= Sw[C_W-(\log_2 B)-1]$ xnor $St\_el[j][C_W-(\log_2 B)-1]$ and
8:     $Sw[C_W-(\log_2 B)-2]$ xnor $St\_el[j][C_W-(\log_2 B)-2]$ and
      . . .
9:     $Sw[0]$ xnor $St\_el[j][0]$;
10: end for

FIG. 5

Algorithm 2 Populating of B-Banks RPE-TCAM ($C_D \times C_W$)

Input: $C_W$ bits TCAM word
Output: Bank$_b$ (where $b$ varies from 0 to B-1)
1: for $i \leftarrow 0$ *to* $i \leftarrow b$ do
2:  if ( TCAM [$C_W$-1 : $C_W$-2] == $i$ ) then
3:   Bank$_i$ = TCAM_Word [$C_W$-3 : 0];
4:  end if
5: end for

FIG. 6

TABLE I: Comparison with Other State-of-the-Art TCAM Designs

| Design | Size | FPGA (Tech.) | Power (mW) | Speed (MHz) | uL (cc) |
|---|---|---|---|---|---|
| Xilinx Locke [1] | 256 × 32 | Virtex-5 (65 nm) | 100 | 1406 | 16 |
| HP-TCAM [5] | 512 × 36 | Virtex-6 (40 nm) | 180 | 118 | 512 |
| Xilinx SDNet [2] | 512 × 128 | Virtex-7 (28 nm) | 90 | 171 | 512 |
| UE-TCAM [6] | 512 × 36 | Virtex-6 (40 nm) | 80 | 202 | 512 |
| DURE [7] | 512 × 36 | Virtex-6 (40 nm) | 50 | 335 | 64 |
| G-AETCAM [8] | 512 × 36 | Virtex-6 (40 nm) | 119 | 358 | 1 |
| RPE-TCAM | 512 × 36 | Virtex-6 (40 nm) | 71 | 319 | 1 |

(uL: update latency; cc: clock cycles; Tech.: Technology in nm; Power: Dynamic power consumption)

FIG. 8

BANK-SELECTIVE POWER EFFICIENT CONTENT-ADDRESSABLE MEMORY

CROSS-REFERENCE TO RELATED APPLICATIONS

The present application claims priority from U.S. Provisional Patent Application No. 63/042,604 filed Jun. 23, 2020, and the disclosure of which is incorporated herein by reference in its entirety.

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

The present invention generally relates to content-addressable memory (CAM). More specifically, the present invention relates to reconfigurable content-addressable memory implementable in field-programmable gate arrays (FPGAs).

BACKGROUND OF THE INVENTION

CAM is specialized hardware that accelerates the parallel searching of large lookup tables for data-intensive applications. In networking, packet classification and forwarding are achieved using a ternary CAM (TCAM) that stores wild cards ("don't care" bits) and results in a match for every search operation. A binary CAM (BiCAM) can only handle "1" and "0" but not wild cards. Both BiCAM and TCAM have different applications, including access control lists, routing tables, and translation lookaside buffers (TLBs).

Recent developments in art are advancing toward software-defined networking (SDN), which requires flexible, reconfigurable, and high-performance hardware for its implementation. Compared to ASIC-based CAMs, which are less reconfigurable, expensive, and challenging to integrate, FPGAs are the most pertinent platforms to implement SDNs where it needs a software-defined (i.e., FPGA-based) CAM, instead of hard-wired (i.e., ASIC-based) CAM.

FPGA-based CAMs are becoming popular due to the aforementioned capabilities. However, most of the existing architectures activate the whole hardware for each search operation, thus have high latency and power consumption. For examples, Xilinx presents two CAM architectures in an application note [1]. A TCAM design based on LUTRAM presented in [2] requires 64 clock cycles to update a single entry in TCAM. A hierarchical CAM design presented in [3] divides the storing memory into low and high priority blocks. A fast-updating architecture presented in [4] updates a single rule in BRAM-based TCAM in which the worst-case latency remains high and is equal to the depth of BRAM in modern FPGAs, i.e., 512. Therefore, there is an unmet need in the art for a power-efficient CAM design on existing FPGA architectures.

SUMMARY OF THE INVENTION

According to one aspect of the present invention, a power efficient CAM architecture that is implementable on FPGAs is provided. The provided CAM architecture comprises an array of content-addressable memory (CAM) cells having a width $C_W$ and a depth $C_D$, and being grouped into a B number of memory banks; a decoder configured for decoding a $C_W$-bits input search key to obtain a n-bits selector key to address a memory bank to be activated for searching operation, where $n=\log_2 B$; and a clock-gating logic for passing a clock signal going to the addressed memory bank while stopping the clock signal going to other memory banks. Each of the CAM cells is configured for storing a memory bit and comprises a plurality of flip-flops configured to store at least a masking bit indicating the ternary nature of the stored memory bit and a storing bit saving the binary information of the stored memory bit.

According to another aspect of the present invention, the operation of the provided CAM architecture comprises the following steps: decoding, with a decoder, a $C_W$-n bits input search key to obtain a n-bits selector key from to address a memory bank to be activated for searching operation, where $n=\log_2 B$; passing, with a clock-gating logic, a clock signal going to the addressed memory bank while stopping the clock signal going to other memory banks; selecting, with a multiplexer configured, output of the activated one of the B number of memory banks; comparing, with a plurality of comparators, $C_W$-n bits of the input search key with $C_W$-n stored rules to output $C_W$-n compared results; generating, with a plurality of masking gates, $C_W$-n match lines for the input search key based on the $C_W$-n compared results and $C_W$-n corresponding masking bits; and providing, with a priority encoder, one or more address of one or more matched stored rule based on the match-lines.

The provided CAM architecture allows activating only one bank in multiple banks irrespective of nature of the data set and is updated in a single access and saves power consumption by only accessing the memory in the activated bank. By accessing only a portion of the hardware to perform the search operation, the dynamic power consumption is reduced by 40% compared with the state-of-the-art FPGA-based CAMs. Furthermore, the provided CAM has an update latency of only one clock cycle compared with the other FPGA-based CAMs as every location is accessed concurrently.

In accordance to one embodiment, the power-saving CAM architecture provided by the present invention is implementable on FPGAs. For example, a CAM with four banks has been implemented on Xilinx Virtex-6 FPGA using Xilinx ISE 14.5 Design Suite. A device XC6VLX760 is used with speed grade-2. The results of dynamic power consumption with 100-MHz frequency and 1.0-V core voltage are measured with a Xilinx XPower Analyzer. Table I as shown in FIG. 8 summarizes the implementation results of the CAM provided by the present invention and its comparison with the state-of-the-art FPGA-based CAMs. As shown in Table I, the CAM architecture provided by the present invention outperforms the existing state-of-the-art CAM architectures in the update latency and power consumption with no compromise on the speed (throughput) of the CAM architecture on a target FPGA device. It should also be noted that the CAM architecture provided by the present invention uses even less hardware utilization, has less power consumption, and has higher speed values when it is configured as a BiCAM compared to being configured as a TCAM, while other CAM architectures have the same cost and performance for BiCAM and TCAM architectures.

LISTING OF REFERENCES

[1] K. Locke, "Parameterizable content-addressable memory," Xilinx, San Jose, Calif., USA, Appl. Note XAPP1151, 2011.

[2] *Ternary Content Addressable Memory (TCAM) Search IP for SDNet*, Xilinx Product Guide, San Jose, Calif., USA, November 2017.
[3] Z. Qian and M. Margala, "Low power RAM-based hierarchical CAM on FPGA," in *Proc. Int. Conf. ReConFigurable Comput.*, December 2014, pp. 1-4.
[4] F. Syed, Z. Ullah, and M. K. Jaiswal, "Fast content updating algorithm for an SRAM-based TCAM on FPGA," *IEEE Embedded Syst. Lett.*, vol. 10, no. 3, pp. 73-76, September 2018.
[5] Z. Ullah, K. Ilgon, and S. Baeg, "Hybrid partitioned SRAM-based ternary content addressable memory," *IEEE Trans. Circuits Syst. I, Reg. Papers*, vol. 59, no. 12, pp. 2969-2979, December 2012
[6] Z. Ullah, M. K. Jaiswal, R. C. C. Cheung, and H. K. H. So, "UE-TCAM: An Ultra Efficient SRAM-based TCAM," in *Proc. IEEE Region Conf.*, November 2015, pp. 1-6.
[7] I. Ullah, Z. Ullah, U. Afzaal, and J.-A. Lee, "DURE: An Energy- and resource-efficient TCAM architecture for FPGAs with dynamic updates," *IEEE Trans. Very Large Scale Integr. (VLSI) Syst.*, vol. 27, no. 6, pp. 1298-1307, June 2019.
[8] M. Irfan and Z. Ullah, "G-AETCAM: Gate-based area-efficient ternary content-addressable memory on FPGA," *IEEE Access*, vol. 5, pp. 20785-20790, 2017.

The disclosures of the above-listed references are incorporated herein by reference in their entities.

BRIEF DESCRIPTION OF THE DRAWINGS

Embodiments of the invention are described in more detail hereinafter with reference to the drawings, in which:

FIG. 5 shows an Algorithm 1 for search operation of the CAM architecture;

FIG. 6 shows an Algorithm 2 for populating of the memory banks based on a 2-bits selector key;

FIG. 8 summarizes the implementation results of the CAM provided by the present invention and its comparison with the state-of-the-art FPGA-based CAMs.

DETAILED DESCRIPTION

In the following description, a power-efficient content-addressable memory (CAM) architecture that is implementable on FPGAs and a method for operating the same are set forth as preferred examples. It will be apparent to those skilled in the art that modifications, including additions and/or substitutions may be made without departing from the scope and spirit of the invention. Specific details may be omitted so as not to obscure the invention; however, the disclosure is written to enable one skilled in the art to practice the teachings herein without undue experimentation.

Figure 1:
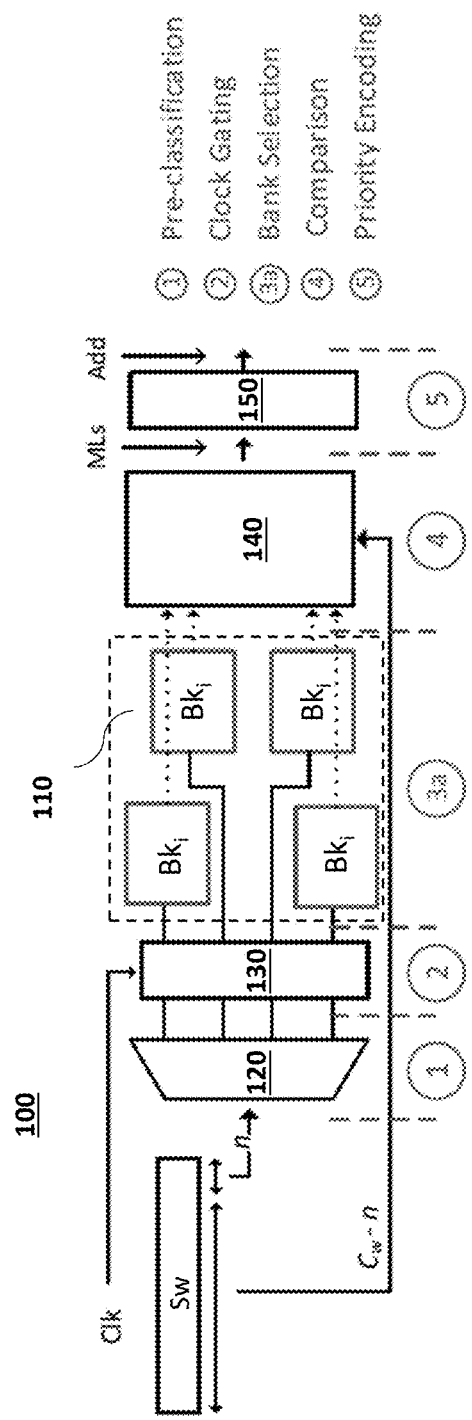
FIG. 1 depicts a power-efficient CAM architecture 100 according to one embodiment of the present invention.

FIG. 1 shows a power-efficient CAM architecture 100 according to one embodiment of the present invention. The CAM architecture may comprise an array of memory cells 110 having a width $C_W$ and a depth $C_D$. In other words, the CAM architecture can store $C_D$ words and each word may include a number $C_W$ bits.

Each of the memory cells is configured for storing a memory bit (or stored rule) and comprises a plurality of flip-flops configured to store at least a masking bit indicating the ternary nature of the stored memory bit and a storing bit saving the binary information of the stored memory bit.

Figure 2:
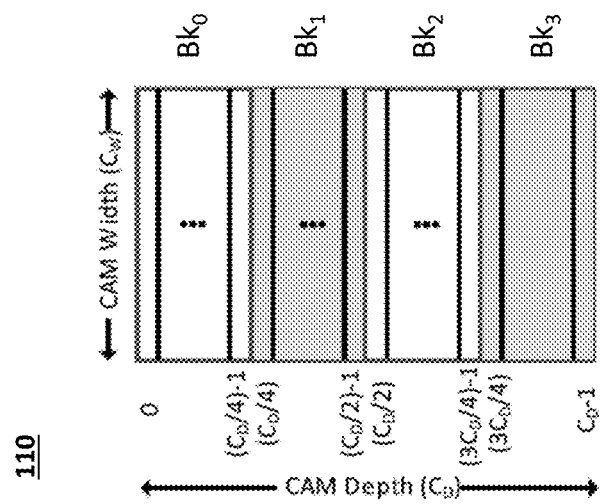
FIG. 2 depicts an exemplary array of memory cells having a size of $C_D \times C_W$ and being divided into four banks.

The CAM architecture 100 may be grouped into a B number of memory banks, $Bk_d$, where d=0, ..., B-1. FIG. 2 shows an exemplary array of memory cells having a size of $C_D \times C_W$ and being divided into four banks, $Bk_0$, $Bk_1$, $Bk_2$ and $Bk_3$. Each bank has a width $C_W$ and a depth equal to $C_D/B$. That means, each bank can store $C_D/B$ words and $Bk_d$ has a starting location at $(C_D*d/B)$-th row and an ending location at $[C_D*(d+1)/B-1]$-th row. For examples, $Bk_0$ has a starting location at $0^{th}$ row and an ending location at $(C_D/4-1)^{th}$ row; $Bk_1$ has a starting location at $(C_D/4)^{th}$ row and an ending location at $(C_D/2-1)^{th}$ row; $Bk_2$ has a starting location at $(C_D/2)^{th}$ row and an ending location at $(3C_D/4-1)^{th}$ row; and $Bk_3$ has a starting location at $(3C_D/4)^{th}$ row and an ending location at $(C_D-1)^{th}$ row.

The CAM architecture 100 may further comprise a decoder 120, such as a n:2n decoder, configured for decoding a $C_W$-bits input search key, $S_w$, to obtain a n-bits selector key to address a memory bank to be activated for searching operation, where n=$\log_2 B$. The position of selector key can be the most significant bits (MSBs), the least significant bits (LSBs), or even in the middle of the search keys based on the distribution of ternary/binary data and type of application. For example, in access control systems, selecting LSBs as selector key evenly distribute the keys among the banks of the proposed TCAM architecture.

The data patterns (storing rules) are mapped (or populated) to the corresponding bank based on the n-bits selector key. The number of bits of the selector key, n, is determined by the number of banks using the equation: n=$\log_2 B$.

The CAM architecture 100 may further comprise a clock-gating logic 130 for passing a clock signal, Clk, going to the addressed memory bank while stopping the clock signal going to other memory banks. Preferably, the clock-gating logic 130 may include a combination of AND gates used to allow or stop the clock signal going to each bank.

The CAM architecture may further comprise a plurality of comparators 140 configured to compare $C_W$-n bits of the input search key with $C_W$-n stored rules to output $C_W$-n match lines, MLs.

The CAM architecture may further comprise a priority encoder configured for providing one or more address, Add, of one or more matched stored rule based on the match lines.

Figure 3:
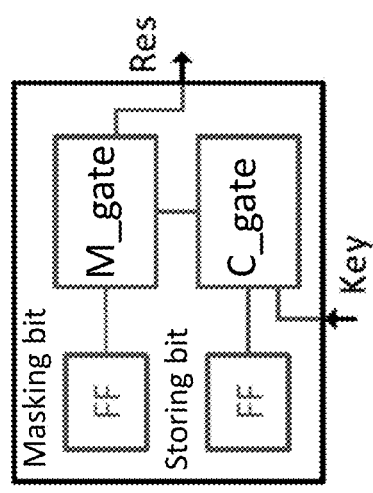
FIG. 3 depicts more details on how the searching operation is performed at each memory cell.

FIG. 3 shows more details on how the searching operation is performed at each memory cell 301. Referring to FIG. 3, each comparator 302 may comprise a comparison gate, C_gate, configured to compare a bit of the input search key with a stored rule (storing bit) stored in the memory cell 301 to output a match line; and a masking gate, M_gate, configured to receive the compared result from the comparison gate, C_gate, and generate a match line based on the compared result and a corresponding masking bit stored in the memory cell 301.

Figure 4:
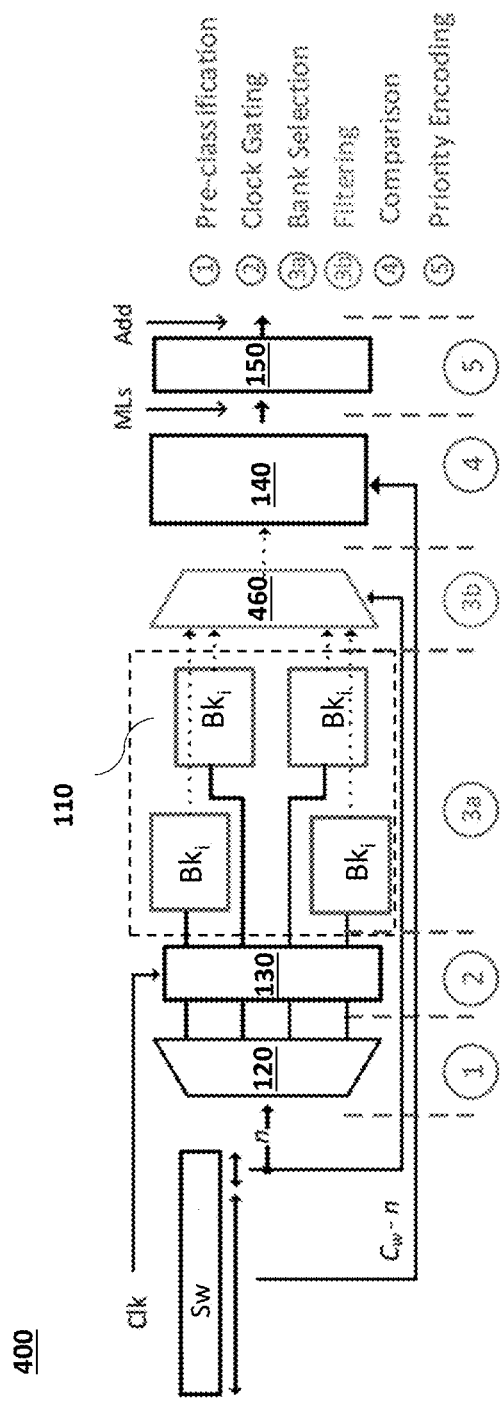
FIG. 4 depicts a power-efficient CAM architecture according to another embodiment of the present invention.

FIG. 4 shows a power-efficient CAM architecture 400 according to another embodiment of the present invention, which is a hardware-saving extension of the embodiment in FIG. 2. Referring to FIG. 4. The CAM architecture 400 is similar to the CAM architecture 100 except for including a multiplexer 460 configured to select output of the activated one of the B number of memory banks such that the number of comparators to be used for the searching operation can be reduced.

Referring back to FIG. 1, the operation of the CAM architecture may include five stages. Stage-1 is the pre-classification in which the decoder 120 is used to decode a $C_W$-bits input search key to obtain a n-bits selector key that determine the bank where the input key needs to be stored, or the search key needs to be searched. At this stage, only one of the 2n=B banks is selected to perform the searching or storing operation. Stage-2 is the clock gating (CG), in which the clock gating logic 130 is used to allow or stop the clock signal going to each bank. The clock signal to only one bank is allowed, and all others are stopped based on the pattern of selector key. Stage-3a is the bank-selection. Stage-4 is comparison in which the comparators 140 are used to compare the $C_W$-n bits of the search key and the stored rules from the addressed memory banks, generating $C_D$ match lines (MLs) that are fed into the priority encoder 150 in Stage-5 to provide one or more address of one or more matched stored rule based on the match lines.

Referring back to FIG. 4, the operation of the CAM architecture may further include a Stage 3b in which the multiplexer 460 is used to select output of the activated one of the B number of memory banks such that the number of comparators to be used for the searching operation can be reduced.

FIG. 5 shows an Algorithm 1 for search operation of the CAM architecture. The selector key in the search word ($S_w$) determines the bank that needs to be searched. The variables x and y determine that starting and ending location of a bank B. The search words ($S_w$) are compared with stored rules (St_el) by means of XNOR gates to generate the match lines (M_L).

FIG. 6 shows an Algorithm 2 for populating of the memory banks based on a 2-bits selector key. For examples, the rules having selector key equal to "00" will be mapped to $Bank_0$, "01" to $Bank_1$, and "10" to $Bank_2$, and the rules with selector key "11" are mapped to $Bank_3$.

Preferably, the memory is divided into four memory banks. As only one bank is selected, only 25% of the total flip-flops are activated to perform the searching or storing operation. Theoretically, 75% of the comparators are reduced by an extra multiplexer. Other numbers of banks have been explored to find the optimal configuration of bank-selective CAM. For example, for two banks, 50% power improvement is expected, but there is almost no improvement. Similarly, if the number of banks is eight or sixteen, 87.5% or 93.75% power improvement respectively is expected, but the power consumption increases due to the large overhead of multiplexer and clock gating circuitry. Thus, the architecture with the memory divided into four memory banks is the optimal choice for power saving in FPGA-based CAM architectures.

In practical applications, because the data are randomly distributed and the chances of all the rules having the same selector bits are minimal. Therefore, the rules may not be evenly distributed among the memory banks and overflowing of rules to a particular bank may occur. For example, a 64×36 CAM can store 64 rules of any pattern. If we divide 64×36 CAM into four banks, given that the number of bits of selector key is two, each bank has a capacity of 16 rules. If there are rules after 16, say, the $17^{th}$ rule, to be mapped to in $Bank_0$ which already has 16 rules, the $17^{th}$ rule is overflowed.

Figure 7:
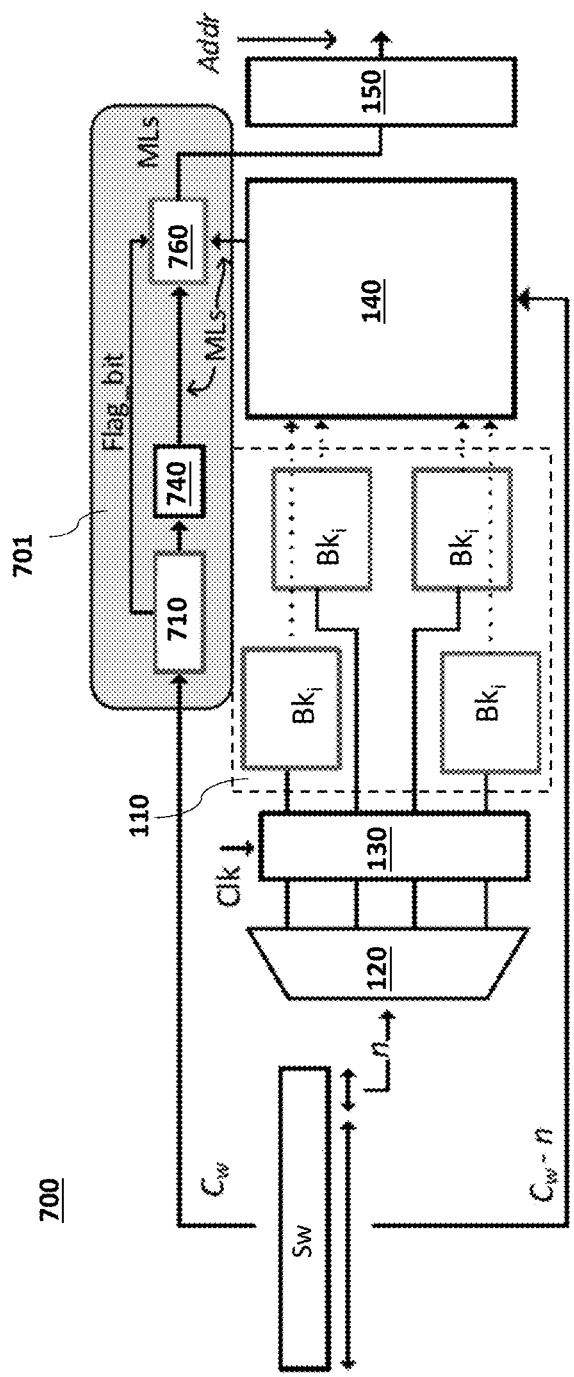
FIG. 7 depicts a power-efficient CAM architecture 700 according to another embodiment of the present invention.

FIG. 7 shows a power-efficient CAM architecture 700 according to another embodiment of the present invention.

Referring to FIG. 6, the CAM architecture 700 is similar to the CAM architecture 100 except for including bank overflow module 701 configured for overcoming bank overflow. The bank overflow module 701 includes a backup CAM 710 configured for storing overflowed rules; a plurality of extra comparators 740 configure for comparing a search word with the overflowed rules stored in the backup CAM 710; and a multiplexer 760 configured for selecting match lines for the activated one of the memory banks of the CAM 110 as well as the backup CAM 710.

The backup CAM 710 may have a width similar to the width of the CAM 110, and a depth equal to half of one of the banks, $Bk_i$. In other words, the backup CAM 710 may have a width of $C_W$ and a depth of $C_D/(B*2)$. If the rules having the same selector key are more than the depth of one bank in the CAM 110, the remaining rules are stored in backup CAM 710. For example, the CAM 110 is a 64×36 CAM and divided into four banks, each bank can store 16 rules. If there are rules after 16, say, the $17^{th}$ rule, to be mapped to in $Bank_0$ which already has 16 rules, it will be stored in the backup CAM 710.

A Flag_bit is used to indicate whether there are overflowed rules stored in the backup CAM 710. If the Flag_bit is high, match lines generated from the bank overflow module 701 will be forwarded to the priority encoder 150.

The foregoing description of the present invention has been provided for the purposes of illustration and description. It is not intended to be exhaustive or to limit the invention to the precise forms disclosed. Many modifications and variations will be apparent to the practitioner skilled in the art.

The apparatuses and the methods in accordance to embodiments disclosed herein may be implemented using computing devices, computer processors, or electronic circuitries and other programmable logic devices configured or programmed according to the teachings of the present disclosure. Computer instructions or software codes running in the computing devices, computer processors, or programmable logic devices can readily be prepared by practitioners skilled in the software or electronic art based on the teachings of the present disclosure.

All or portions of the methods in accordance to the embodiments may be executed in one or more computing devices including server computers, personal computers, laptop computers, mobile computing devices such as smartphones and tablet computers.

The embodiments were chosen and described in order to best explain the principles of the invention and its practical application, thereby enabling others skilled in the art to understand the invention for various embodiments and with various modifications that are suited to the particular use contemplated.

What is claimed is:
1. An electronic memory device comprising:
   an array of content-addressable memory (CAM) cells having a width $C_W$ and a depth $C_D$, and being grouped into a B number of memory banks;
   a decoder configured for decoding a $C_W$-n bits input search key to obtain a n-bits selector key to address a memory bank to be activated for searching operation, where n=$\log_2 B$; and
   a clock-gating logic for passing a clock signal going to the addressed memory bank while stopping the clock signal going to other memory banks;
   wherein each of the CAM cells is configured for storing a memory bit and comprises a plurality of flip-flops configured to store at least a masking bit indicating the ternary nature of the stored memory bit and a storing bit saving the binary information of the stored memory bit.

2. The electronic memory device in accordance with claim 1, wherein B is equal to four.

3. The electronic memory device in accordance with claim 1, further comprising:
   a plurality of comparators configured to compare a plurality of bits of the input search key with a plurality of stored rules to output a plurality of match lines.

4. The electronic memory device in accordance with claim 1, wherein each comparator includes:
   a comparison gate configured to compare a bit of the input search key with a stored rule to output a match line; and
   a masking gate configured to receive the compared result from the comparison gate and generate a match line based on the compared result and a corresponding masking bit.

5. The electronic memory device in accordance with claim 1, further comprising a multiplexer configured to select output of the activated one of the B number of memory banks; and
   wherein:
   the plurality of comparators is configured to compare $C_W$-n bits of the input search key with $C_W$-n stored rules to output $C_W$-n compared results;
   the plurality of masking gates is configured to receive the $C_W$-n compared results respectively and generate $C_W$-n matching lines for the input search key.

6. The electronic memory device in accordance with claim 1, further comprising a priority encoder configured to provide one or more address of one or more matched stored rule based on the match-lines.

7. The electronic memory device in accordance with claim 1, further comprising a backup content-accessible memory bank configured for overcoming bank overflow and having a width equals to that of each of the memory banks and a depth equals to a half of that of each of the memory banks.

8. The electronic memory device in accordance with claim 1, wherein each of the plurality of CAM cells has a binary content-addressable memory (BiCAM) structure.

9. The electronic memory device in accordance with claim 1, wherein each of the plurality of CAM cells has a ternary content-addressable memory (TCAM) structure.

10. The electronic memory device in accordance with claim 1, the plurality of flip-flops is implementable on a field-programmable gate array (FPGA).

11. The electronic memory device in accordance with claim 9, the FPGA is reconfigurable.

12. A method for operating an electronic memory device including an array of content-addressable memory (CAM) cells having a width $C_W$ and a depth $C_D$ implemented with a field-programmable gate array and divided into a B number of memory banks, each of the CAM memory cells is configured for storing a memory bit and comprises a plurality of flip-flops configured to store at least a masking bit indicating the ternary nature of the stored memory bit and a storing bit saving the binary information of the stored memory bit; the method comprising:
   decoding, with a decoder, a $C_W$-n bits input search key to obtain a n-bits selector key from to address a memory bank to be activated for searching operation, where n=log$_2$B; and
   passing, with a clock-gating logic, a clock signal going to the addressed memory bank while stopping the clock signal going to other memory banks;
   selecting, with a multiplexer configured, output of the activated one of the B number of memory banks;
   comparing, with a plurality of comparators, $C_W$-n bits of the input search key with $C_W$-n stored rules to output $C_W$-n compared results;
   generating, with a plurality of masking gates, $C_W$-n match lines for the input search key based on the $C_W$-n compared results and $C_W$-n corresponding masking bits; and
   providing, with a priority encoder, one or more address of one or more matched stored rule based on the match-lines.

13. The method in accordance with claim 12, wherein B is equal to 4.

14. The method in accordance with claim 12, wherein each of the plurality of CAM cells has a binary content-addressable memory (BiCAM) structure.

15. The method in accordance with claim 12, wherein each of the plurality of CAM memory cells has a ternary content-addressable memory (TCAM) structure.

* * * * *